United States Patent
Kwon (10) Patent No.: US 12,477,657 B2
(45) Date of Patent: Nov. 18, 2025

(54) DISPLAY APPARATUS

(71) Applicant: LG Display Co., Ltd., Seoul (KR)

(72) Inventor: Hakyeol Kwon, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 205 days.

(21) Appl. No.: 18/499,796

(22) Filed: Nov. 1, 2023

(65) Prior Publication Data

US 2024/0172369 A1    May 23, 2024

(30) Foreign Application Priority Data

Nov. 10, 2022   (KR) .......................... 10-2022-0149832

(51) Int. Cl.
   *H05K 1/18*    (2006.01)
(52) U.S. Cl.
   CPC ............. *H05K 1/189* (2013.01); *H05K 1/181* (2013.01); *H05K 2201/10128* (2013.01)
(58) Field of Classification Search
   CPC ..................... H05K 1/189; H05K 2201/10128
   See application file for complete search history.

(56) References Cited

U.S. PATENT DOCUMENTS

| 2018/0153038 A1* | 5/2018 | Kim ................... H05K 7/20436 |
| 2021/0011681 A1* | 1/2021 | Won ....................... H10K 59/00 |
| 2022/0322008 A1* | 10/2022 | Ahn ......................... H05K 5/03 |

FOREIGN PATENT DOCUMENTS

KR    10-2021-0085052 A    7/2021

* cited by examiner

*Primary Examiner* — Sherman Ng
(74) *Attorney, Agent, or Firm* — Fenwick & West LLP (57) ABSTRACT

A display apparatus is disclosed that includes a display panel, a source printed circuit board placed on a back surface of the display panel and connected to the display panel via a first flexible circuit board, a control printed circuit board connected to the source printed circuit board via a second flexible circuit board, and a holder member arranged on the source printed circuit board to hold the control printed circuit board. According to this disclosure, it is possible to reduce movement of the control printed circuit board and prevent damage, during logistics transportation, by allowing stable fixation of the control printed circuit board.

14 Claims, 11 Drawing Sheets

DISPLAY APPARATUS

CROSS REFERENCE TO RELATED APPLICATION

The present application claims priority to Republic of Korea Patent Application No. 10-2022-0149832, filed on Nov. 10, 2022, which is incorporated by reference in its entirety.

BACKGROUND

Field of Technology

This disclosure relates to a display apparatus, and more particularly, to a display apparatus capable of stably fixing the control printed circuit board to reduce movement of the control printed circuit board during logistics transportation while simultaneously simplifying the manufacturing process.

Description of the Related Art

As examples of representative displays, liquid crystal display (LCD) apparatuses and organic light emitting display (OLED) apparatuses including self-luminous devices are expanding their application scope to various fields including include car instrument panels, car windshields, display parts of mirrors, and indoor/outdoor signage, in addition to traditional electronic devices such as TVs. Such display apparatuses require optimization to suit their usage environment.

With the advent of the era of electric vehicles, many car manufacturers are equipping their electric cars with display apparatuses such as a LCD display apparatus and an OLED display apparatus to display various vehicle operation information.

As a result, display manufacturers have recently been supplying many display apparatuses to car manufacturers. In this regard, it is crucial to deliver display apparatuses stably, as a defective product during logistics can cause production delays and damage customer trust.

Meanwhile, the display apparatus includes a source printed circuit board (S-PCB) and a control printed circuit board (C-PCB), and in the manufacturing process of the display apparatus, the control printed circuit board is positioned on top of the source printed circuit board and fixed with a fixing tape.

With this type of fixed structure, there is a risk of the control printed circuit board becoming loose and moving during transportation if the fixing tape comes off.

In addition, when assembling the set, the control printed circuit board is separated by removing the fixing tape that holds it in place and disconnecting the flexible printed circuit (FPC) connected to the connector on the source printed circuit board.

Afterward, the set mid-frame is positioned on top of the source printed circuit board, the control printed circuit board is placed on top of the set mid-frame, and the flexible circuit board, which was connected to the connector of the source printed circuit board, is connected to the connector of the control printed circuit board through a through-hole formed in the set mid-frame.

This manufacturing method complicates the production process of the display apparatus.

SUMMARY

This disclosure has been conceived to solve the above issues in the related technical field, and it is an object of the disclosure to provide a display apparatus capable of stably fixing the control printed circuit board to reduce its movement during logistics transportation while simultaneously simplifying the manufacturing process.

In order to accomplish the above object, this disclosure relates to a display apparatus, which may include a display panel, a source printed circuit board placed on the back surface of the display panel and connected to the display panel via a first flexible circuit board, a control printed circuit board connected to the source printed circuit board via a second flexible circuit board, and a holder member arranged on the source printed circuit board to hold the control printed circuit board.

Also, according to an embodiment of this disclosure, the holder member may include a connecting part fixed to the source printed circuit board, a bending part connected rotatably to the connecting part, and a head part connected to the bending part and configured to hold the control printed circuit board.

Also, according to an embodiment of this disclosure, the head part may include a first plate contacting one surface of the control printed circuit board and a second plate connected to the first plate and contacting the other surface of the control printed circuit board, and the first and second plates may have a distance corresponding to the thickness of the control printed circuit board.

Also, according to an embodiment of this disclosure, the head part may include a guide portion formed at the end of the first plate and guiding the control printed circuit board to be inserted between the first plate and the second plate.

Also, according to an embodiment of this disclosure, the guide portion may form a curve in a direction opposite to the direction facing the second plate from the first plate.

Also, according to an embodiment of this disclosure, the bending part may include a first block connected to a side of the head part, a second block connected to a side of the connecting part, and a bending bar connecting the first and second blocks.

Also, according to an embodiment of this disclosure, the bending part may further include a first pin connecting the first block and the bending bar, and the first block or the bending bar may be rotatable around the first link pin as the axis of rotation.

Also, according to an embodiment of this disclosure, the bending part may further include a second link pin connecting the second block and the connecting part, and the second block may be rotatable around the second link pin as the axis of rotation.

Also, according to an embodiment of this disclosure, the display apparatus may further include an adjustment part engaged between the bending bar and the second block to adjust the rotation range of the bending bar.

Also, according to an embodiment of this disclosure, the adjustment part may include a movement hole formed along a longitudinal direction of the second block and a moving pin connected to the bending bar and arranged inside the movement hole, and the moving pin may be changed in position inside the movement hole to adjust the rotation range of the bending bar.

Also, according to an embodiment of this disclosure, the adjustment part may further include a serrated portion arranged along the longitudinal direction of the movement hole to fix the position of the moving pin.

Also, according to an embodiment of this disclosure, the movement hole may include an inner surface formed with a polygonal shape.

Also, according to an embodiment of this disclosure, the moving pin may include an outer surface formed with a polygonal shape corresponding to the inner surface of the movement hole, and the inner surface of the movement hole and the outer surface of the moving pin may generate a contact frictional resistance to fix the rotation position of the bending bar.

Also, according to an embodiment of this disclosure, the display panel and one end of the source printed circuit board may be connected via the first flexible circuit board, and the control printed circuit board and the other end of the source printed circuit board may be connected via the second flexible circuit board.

Also, according to an embodiment of this disclosure, the source printed circuit board may further include a first connector configured to be connected to the second flexible circuit board, and the holder member may be disposed in multiple quantities on both sides of the first connector.

According to this disclosure, the manufacturing process of the display apparatus can be simplified by directly attaching the FPC, which connects the S-PCB and the C-PCB, to the set mid-frame without the need to separate it from the connector, unlike the conventional method.

In addition, by allowing stable fixation of the control printed circuit board during logistics transportation, it is possible to reduce its movement and prevent damage.

Furthermore, by eliminating the need for fixing tape, it is possible to reduce the manufacturing cost.

DETAILED DESCRIPTION

Advantages and features of this disclosure and methods of accomplishing the same may be understood more readily by reference to the detailed description of embodiments that will be made hereinafter with reference to the accompanying drawings. This disclosure may, however, be embodied in many different forms and should not be construed as being limited to the exemplary embodiments set forth herein; rather, these exemplary embodiments are provided so that this disclosure will be thorough and complete and will fully convey the concept of the invention to those skilled in the art, and the present invention will only be defined by the appended claims.

The shapes, sizes, ratios, angles, numbers and the like illustrated in the drawings to describe embodiments of this disclosure are merely exemplary, and thus, the disclosure is not limited thereto. Throughout the specification, the same reference numerals refer to the same components. In addition, detailed descriptions of well-known technologies may be omitted in the disclosure to avoid obscuring the subject matter of the disclosure. When terms such as "comprises," "has," "includes," or "is made up of" are used in this specification, it should be understood that unless "only" is specifically used, additional elements or steps can be included. Unless otherwise explicitly stated, when a component is expressed in the singular form, it is intended to encompass the plural form as well.

In interpreting the components, it is construed to include a margin of error even in the absence of explicit description.

When describing the positional relationship, for example, when the relationship between two parts is described as "on", "on top of", "underneath", "beside", etc., unless "directly" or "immediately" is used, one or more other parts may be located between the two parts.

When a device or layer is referred to as being "on" another device or layer, it includes cases where one device or layer is directly located on the other device or layer or still other device or layer is interposed between the two devices or layers.

Although the terms "first", "second", and the like are used to describe various components, these components are not limited by these terms. These terms are merely used for distinguishing one component from the other components. Therefore, the first component mentioned hereinafter may be the second component in the technical sense of the disclosure.

Throughout the specification, the same reference numerals refer to the same components.

The sizes and thicknesses of each component shown in the drawings are presented for the convenience of description and are not intended to limit the disclosure.

The features of various embodiments of this disclosure can be partially or entirely combined or assembled in various technical manners of interlocking and interoperation obvious to those skilled in the art, and each embodiment can be implemented independently or in combination with related embodiments.

Hereinafter, detailed descriptions are made of the embodiments of the disclosure with reference to the accompanying drawings.

In this disclosure, the term "display apparatus" is used in a narrow sense to refer to display apparatuses, such as a liquid crystal module (LCM), an organic light-emitting diode (OLED) module, and a quantum dot module, each including a display panel and a panel driving unit to operate the display panel. In addition, the term may also be used to refer to set electronic devices, set devices, or apparatuses that include LCMs, OLED modules, quantum dot (QD) modules, and the like, such as equipment display apparatuses including complete or final products such as laptop computers, televisions, computer monitors, automotive displays or equipment displays provided in other forms for vehicles, as well as mobile electronic devices such as smartphones or electronic pads.

Accordingly, in this disclosure, the display apparatus may include not only the display apparatuses in the narrow sense themselves, such as LCMs, OLED modules, QD modules, but also set devices as application products or final consumer devices including LCMs, OLED modules, QD modules, and the like.

Additionally, in some cases, an LCM, an OLED module, or a QD module, composed of a display panel and a panel driving unit may be referred to as "display apparatus" in a narrow sense, while an electronic device as a complete product including an LCM, an OLED module, or a QD module may be referred to as "set device". For example, the narrow-sense display apparatus may include a display panel of liquid crystal (LCD), organic light-emitting diode (OLED), or quantum dot (QD) and a source printed circuit board (PCB) as a control unit for driving the display panel, while a set device may further include a set PCB, serving as a set control unit that is electrically connected to the source PCB and controls the entire set device.

The display panel used in the embodiments may include all types of display panels such as liquid crystal display panels, organic light-emitting diode (OLED) display panels, quantum dot (QD) display panels, and electroluminescent display panels, and is not limited to a specific display panel capable of bending a bezel with a flexible substrate for the OLED display panel and a backplate support structure thereunder. In addition, the display panel used in the embodiments of this disclosure is not limited to the shape or size of the display panel.

For example, when the display panel is an organic light-emitting diode (OLED) display panel, it may include a plurality of gate lines and data lines and pixels formed at the intersection of the gate lines and data lines. In addition, it may be configured to include an array including thin-film transistors as components for selectively applying a voltage to each pixel, an organic light-emitting diode (OLED) layer on the array, an encapsulation substrate or encapsulation layer arranged on the array to cover the organic light-emitting diode layer, etc. The encapsulation layer may protect the thin film transistors and the organic light-emitting device layer from external impacts and prevent moisture or oxygen from penetrating into the organic light-emitting device layer. In addition, the layers formed on the array may include an inorganic light-emitting layer, such as a nano-sized material layer or quantum dots.

Figure 1:
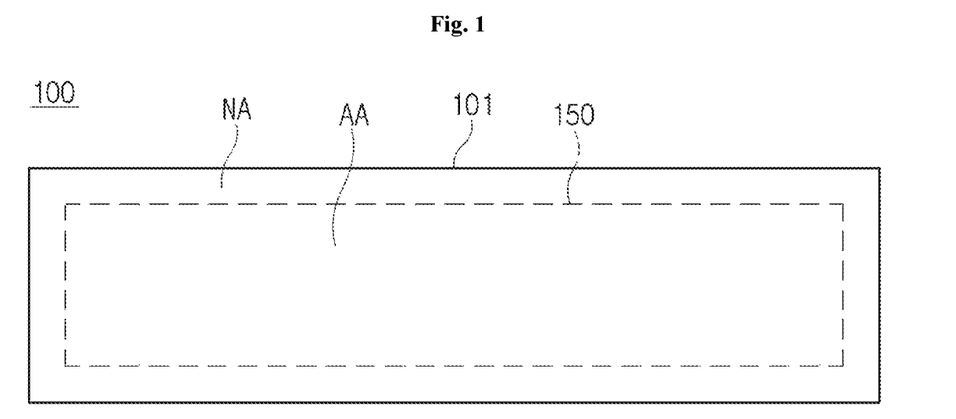
FIG. 1 is a front view of a display apparatus according to an embodiment of this disclosure.

In this disclosure, FIG. 1 illustrates an exemplary organic light-emitting diode (OLED) display panel that may be integrated within display apparatuses.

FIG. 1 is a diagram illustrating a display apparatus according to an embodiment of this disclosure.

With reference to FIG. 1, the display apparatus 100 may be applied to the center fascia of a vehicle. Although FIG. 1 shows a rectangular display panel 150, the shape of the display apparatus 100 is not necessarily limited thereto and can be produced in various shapes such as squares, polygons, or curves.

Referring to FIG. 1, the display apparatus 100 is equipped with integrated display and touch functions, and the cover member 101 is attached to the front. A display panel 150 for displaying may be arranged on the back surface of the cover member 101. The display apparatus 100 may be inserted and coupled to the dashboard of a vehicle. The display panel 150 may be made on a substrate of a rigid material, but in the case of organic light-emitting devices, it may also be made on a flexible substrate. A display panel 150 made on a flexible substrate may be deformed concavely or convexly depending on the shape of the dashboard, allowing for flexible design. The cover member 101 may be a cover glass.

Figure 2:
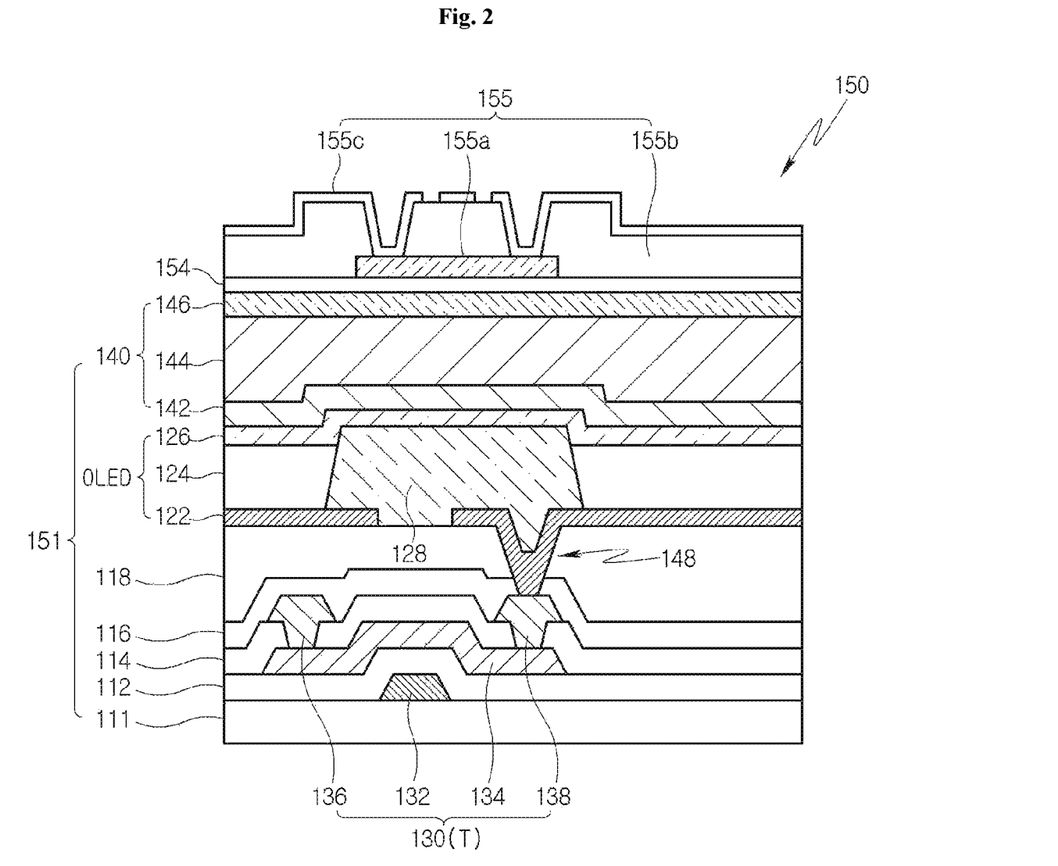
FIG. 2 is a cross-sectional view of a light emitting component according to an embodiment of this disclosure.

FIG. 2 shows the cross-sectional structure of the light emitting component provided in the display panel of FIG. 1 according to an embodiment of this disclosure. The substrate 111 may support various components of the display panel 150. The substrate 111 may be made of a transparent dielectric material such as glass, plastic, and the like. In the case of being made of plastic, the substrate 111 may be a plastic film or a plastic substrate. For example, the substrate 111 may take the form of a film including one of polyimide-based polymers, polyesters-based polymers, silicone-based polymers, acrylic-based polymers, polyolefin-based polymers, and their copolymers. Among these materials, polyimide is mainly used as a plastic substrate because it is suitable for high-temperature processes and is a material that can be coated.

A buffer layer may be positioned on the substrate 111. The buffer layer is a functional layer that protects the thin film transistor (TFT) from impurities such as alkali ions that may leak from the bottom of the substrate 111. The buffer layer may be formed of silicon oxide (SiOx), silicon nitride (SiNx), or multiple layers thereof.

Thin film transistor 130 (T) may be disposed on the buffer layer. The thin film transistor 130 (T) may be formed by sequentially arranging a gate electrode 132, a gate insulating layer 112, a semiconductor layer 134, an interlayer insulating film 114, source electrode 136, and drain electrode 138 on the buffer layer. There may be one or more thin film transistors 130 (T) arranged for a plurality of sub-pixels provided in the active area.

Although illustrated as the bottom-gate type in FIG. 2, the thin film transistor 130 (T) mis not limited thereto and may also be provided as the top-gate type, in which the order of the semiconductor layer 134 and the gate electrode 132 is reversed.

The semiconductor layer 134 may be arranged at a specific portion on the substrate 111 or the buffer layer. The semiconductor layer 134 may be made of polycrystalline silicon (p-Si), and in this case, a region of the semiconductor layer 134 may be doped with impurities to form the electrode layer. The semiconductor layer 134 may also be made of amorphous silicon (a-Si) and various organic semiconductor materials such as pentacene. Furthermore, the semiconductor layer 134 may also be made of an oxide material. The gate insulating layer 112 may be formed of inorganic dielectric materials such as silicon oxide (SiOx) or silicon nitride (SiNx) and, organic dielectric materials. The gate electrode 132 may be formed of various conductive materials, such as magnesium (Mg), aluminum (Al), nickel (Ni), chromium (Cr), molybdenum (Mo), tungsten (W), gold (Au), or alloys thereof.

The interlayer insulating film 114 may be formed of inorganic dielectric materials such as silicon oxide (SiOx) or silicon nitride (SiNx) and, as well, organic dielectric materials. The interlayer insulating film 114 may be selectively removed to form contact holes exposing the source and drain regions.

The source and drain electrodes 136 and 138 are formed as a single layer or multilayer of electrode material on the interlayer insulating film 114.

An inorganic protective film 116 and a planarization layer 118 may be positioned on the thin film transistor 130 (T) to cover the source and drain electrodes 136 and 138. The inorganic protective film 116 and the planarization layer 118 protect the thin film transistor 130 (T) and flatten its upper surface.

The inorganic protective film 116 may be formed of inorganic dielectric films such as silicon nitride (SiNx) and silicon oxide (SiOx), while the planarization layer 118 may be made of organic dielectric films such as Benzocyclobutene (BCB) or acrylic (Acryl). The inorganic protective film 116 and the planarization layer 118 may each be formed as a single-layer, dual-layer, or multilayer structure, and in some cases, one of the two layers may be omitted.

A light-emitting component OLED connected to the thin film transistor (TFT) 130 (T) may be formed by sequentially arranging a first electrode 122, an organic light-emitting layer 124, and a second electrode 126. That is, the light-emitting component OLED may be composed of the first electrode 122 connected to the drain electrode 138 through the via hole 148 formed in the planarization layer 118 and the inorganic protective film 116, the organic light emitting layer 124 positions on the first electrode 122, and the second electrode 126 positioned on the organic light-emitting layer 124.

When the display panel 150 is of a top emission type where the emission occurs upward through the second electrode 126, the first electrode 122 may include an opaque conductive material with high reflectivity. In this case, examples of reflective conductive material may include silver (Ag), aluminum (Al), gold (Au), molybdenum (Mo), tungsten (W), chromium (Cr), or alloys thereof.

A bank 128 is formed in the area excluding the light-emitting area, opening up the light-emitting area. Accordingly, the bank 128 has a bank hole exposing the first electrode 122 corresponding to the light-emitting area. The bank 128 may be made of inorganic dielectric materials such as silicon nitride (SiNx), silicon oxide (SiOx), or organic dielectric materials such as BCB, acrylic-based resins, or imide-based resins.

The organic light-emitting layer 124 is positioned on the first electrode 122 exposed by the bank 128. The organic light-emitting layer 124 may include a hole injection layer, a hole transport layer, an emissive layer, an electron transport layer, and an electron injection layer. In addition, the organic light-emitting layer 124 may be composed of a single emissive layer structure that emits a single light within a single stack or a multi-stack structure including multiple stacks, each of which includes a single emissive layer of the same color. In such cases, adjacent sub-pixels may be arranged to emit different colors of light to display various colors. For example, sub-pixels with emissive layers of red, green, and blue may be arranged in a row or spaced apart from each other and, in a triangle shape or pentile structure with some sub-pixels of predetermined colors aligned parallel and others aligned diagonally to each other.

In some cases, sub-pixels of white color may also be added to the arrangement. In addition, the organic light-emitting layer 124 may be configured by stacking a plurality of stacks including emissive layers emitting different colors of light to express white. In the case of expressing white with a stacked structure, separate color filters may be additionally added to each sub-pixel.

The second electrode 126 is positioned on the organic light-emitting layer 124. When the display panel 150 adopts a top emission structure, the second electrode 126 may be formed of a transparent conductive material such as Indium Tin Oxide (ITO) or Indium Zinc Oxide (IZO) or a semi-transparent metal or metal alloy such as MgAg to emit light generated in the organic light-emitting layer 124 upward through the second electrode 126.

The second electrode 126 may be arranged to reach a capping layer (not shown) of the to. The capping layer may protect the OLED and assist in the extraction of light emitted through the second electrode 126 by using a material with a high refractive index.

An encapsulation layer 140 may be disposed on the light-emitting component OLED. The encapsulation layer 140 prevents or at least reduces the infiltration of oxygen and moisture from the outside to prevent oxidation of the emissive and electrode materials. Exposure of OLED to moisture or oxygen may cause pixel shrinkage or the formation of dark spots, reducing the emitting area. The encapsulation layer 140 is formed by alternately stacking inorganic layers 142 and 146 made of glass, metal, aluminum oxide (AlOx), or silicon (Si) materials and an organic layer 144 that serves as a buffer relieving the stress between layers due to the bending of the display panel (150 in FIG. 1) and enhances the flattening performance. The organic layer 144 may be made of organic dielectric materials such as acrylic resin, epoxy resin, polyimide, polyethylene, or silicon oxycarbide (SiOC). Here, the first and second inorganic layers 142 and 146 serve to block the penetration of moisture or oxygen, while the organic layer 144 flattens the surface of the first inorganic layer 142. The encapsulation layer 140 is composed of several thin film layers to increase the length and complexity of the path that moisture and oxygen must travel compared to a single layer, to make it difficult for moisture and oxygen to penetrate the light-emitting component OLED.

A protective layer (not shown) may be formed further between the light-emitting component OLED and the encapsulation layer 140 to protect the encapsulation layer 140 from being peeled off or affecting the uniformity during the manufacturing process of the encapsulation layer 140.

With reference to FIG. 2, a polarization layer 154 may be disposed on the encapsulation layer 140. The polarization layer 154 may reduce the impact of light entering the display panel 150 from external light sources on the semiconductor layer 134 or the organic light-emitting layer 124.

With reference to FIG. 2, a touch sensor layer 155 may be arranged on the polarization layer 154. The touch sensor layer 155 may be structured with the first touch electrode 155a and the second touch electrode 155c intersecting each other, allowing one electrode to receive an applied voltage signal and the other to sense the voltage signal. The first touch electrode 155a and the second touch electrode 155c may be patterned into polygonal or circular shapes on a touch insulation layer 155b to be arranged at a distance from each other.

The cover member 110 may be disposed on the touch sensor layer 155. The touch sensor layer 155 and the cover member 101 may be bonded together via an adhesive layer interposed therebetween.

Figure 3A:
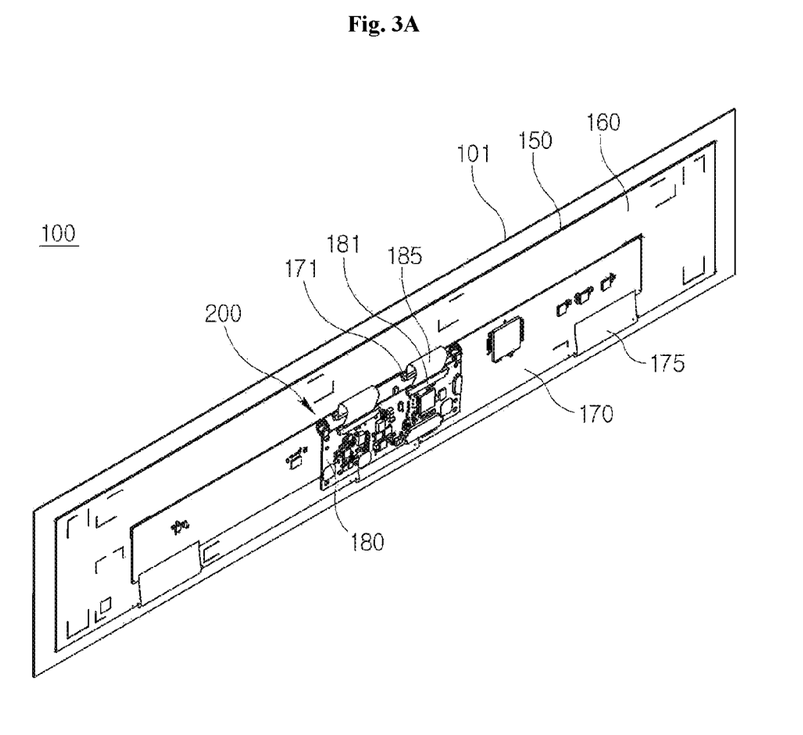
FIG. 3A is a rear perspective view of a display apparatus according to an embodiment of this disclosure.
Figure 3B:
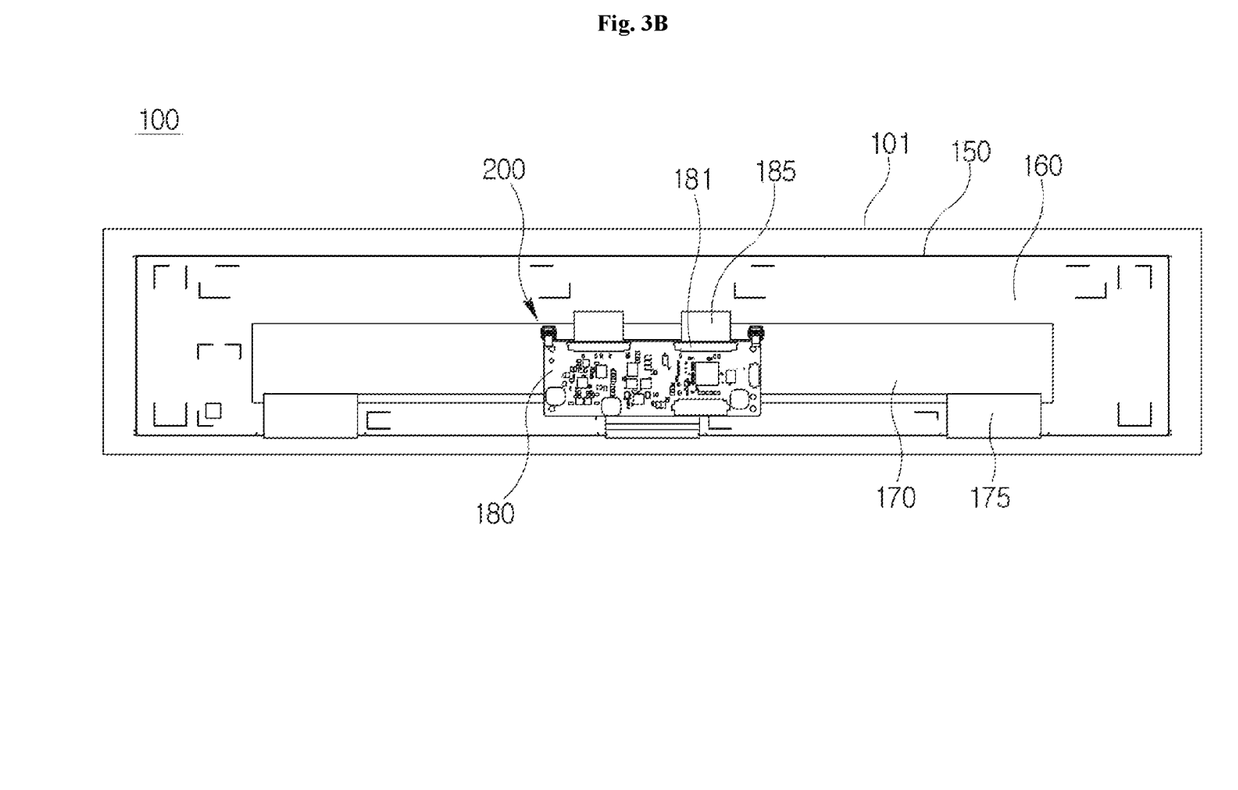
FIG. 3B is a rear view of a display apparatus according to an embodiment of this disclosure.

Meanwhile, FIGS. 3A and 3B show the rear of the display apparatus 100 according to an embodiment of this disclosure.

With reference to FIGS. 3A and 3B, the display apparatus 100 may include a cover member 101, a display panel 150, a heat dissipation plate 160, a source printed circuit board 170, a control printed circuit board 180, and a holder member 200.

The cover member 101 may include an active area AA (see FIG. 1) and an inactive area NA (see FIG. 1). The source printed circuit board 170 may be attached to the back surface of the display panel 150 as shown in FIGS. 3A and 3B. The heat dissipation plate 160 may be disposed between the display panel 150 and the source printed circuit board 170. The heat dissipation plate 160 may be provided to dissipate the heat generated in the display panel to the rear.

The source printed circuit board 170 and the display panel 150 may be connected through a first flexible circuit board 175 such that the source printed circuit board 170 can operate the display panel 150. The first flexible circuit board 175 may be a flexible circuit, a chip on film (COF), or the like.

The control printed circuit board 180 and the source printed circuit board 170 may be connected through a second flexible circuit board 185 such that the control printed circuit board 180 can operate the source printed circuit board 170. Here, the source printed circuit board 170 may be provided with a pair of first connectors 171, and the control printed circuit board 180 may be provided with a pair of second connectors 181. The second flexible circuit board 185 may be connected to the first connector 171 and the second connector 181.

The heat dissipation plate 160 may be disposed on the back surface of the display panel 150 to dissipate the heat generated by the display panel 150. In an embodiment of this disclosure, an aluminum plate may be used, but is not limited thereto.

Figure 4:
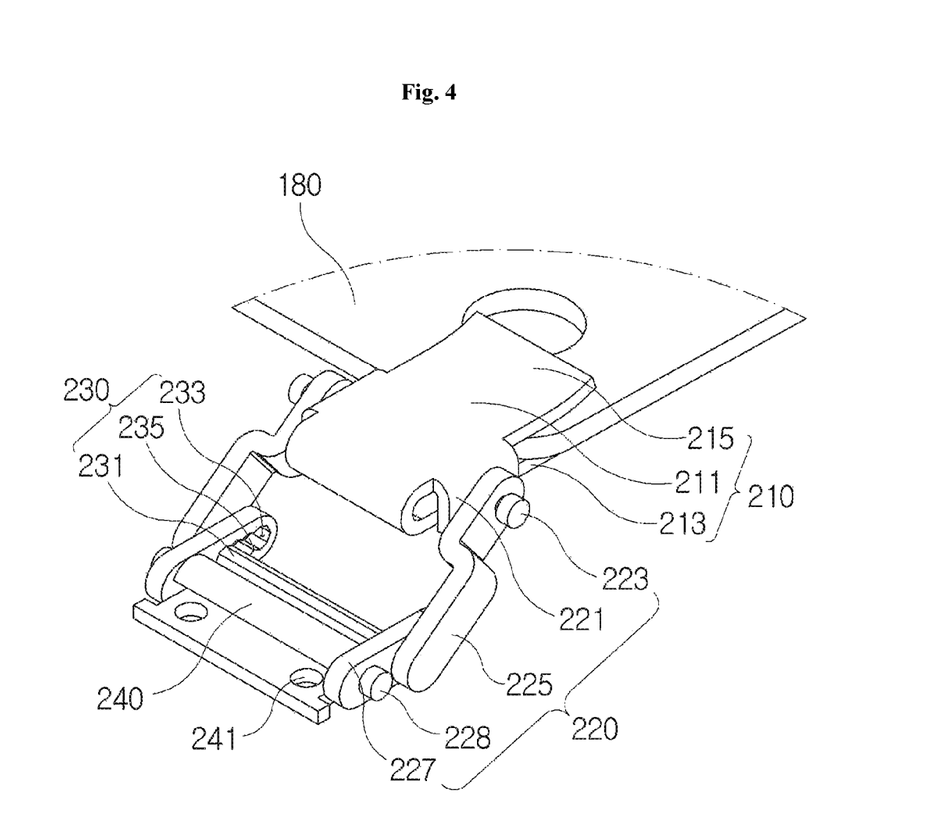
FIG. 4 is a perspective view of a holder member according to an embodiment of this disclosure.
Figure 5:
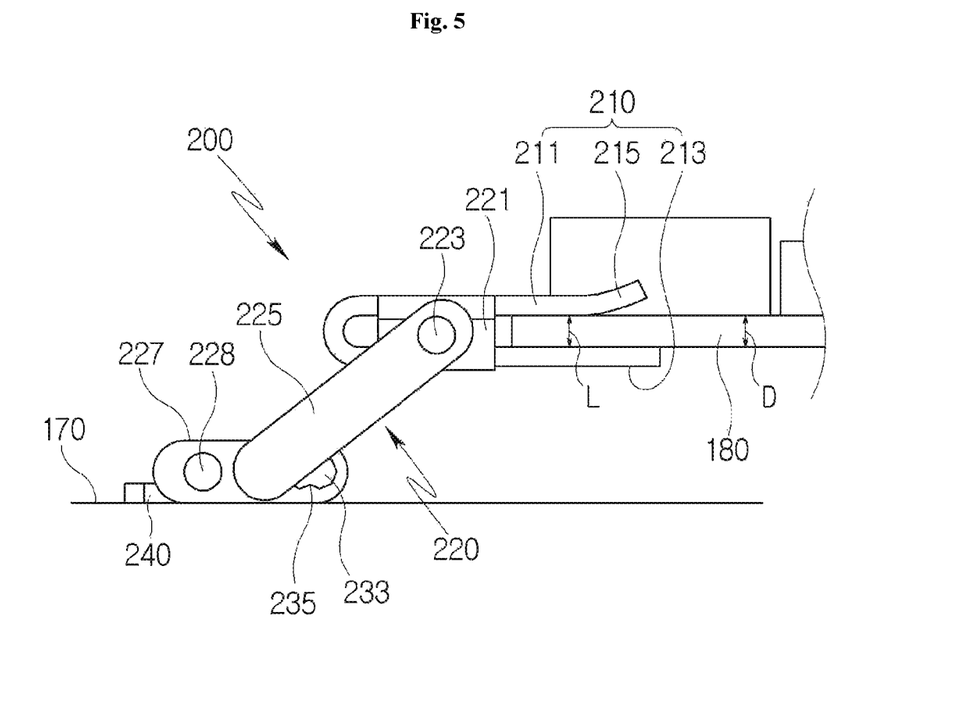
FIG. 5 is a side view of a holder member according to an embodiment of this disclosure.
Figure 6:
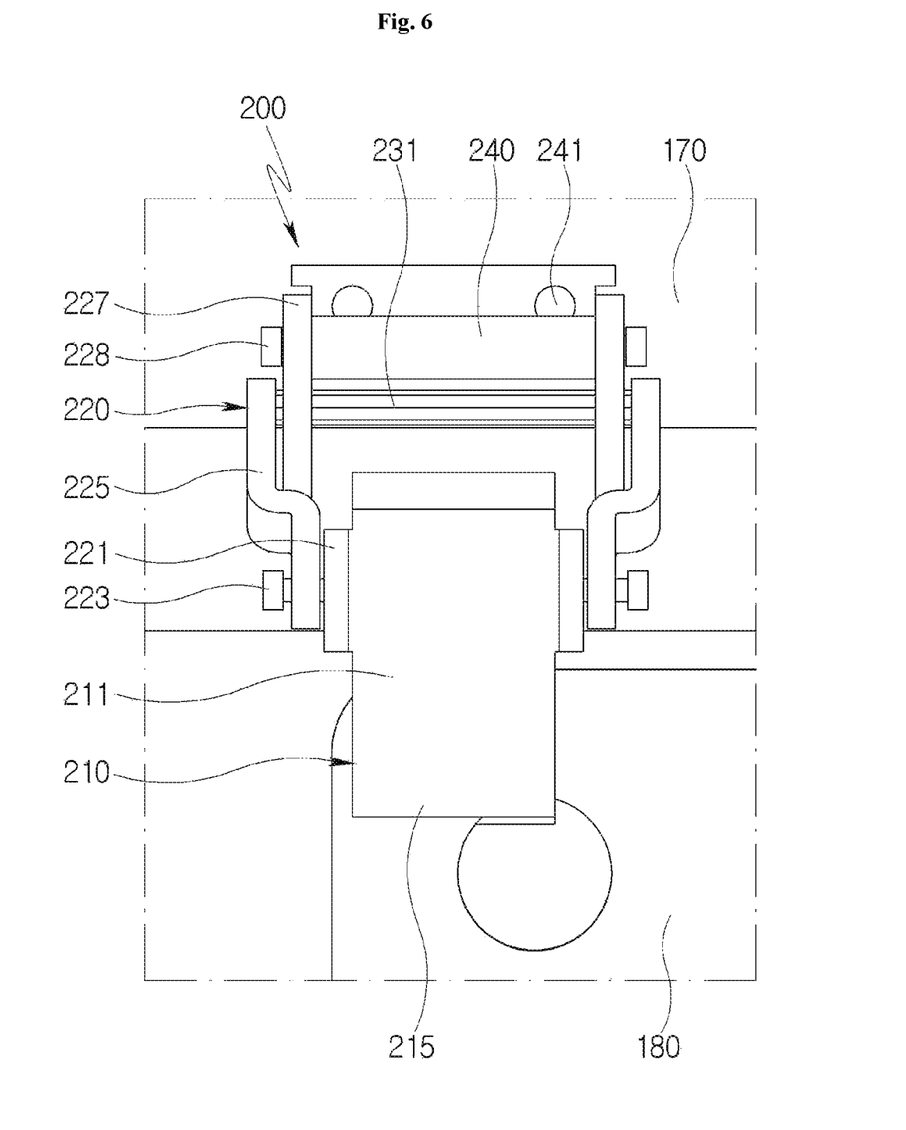
FIG. 6 is a top plan view of a holder member according to an embodiment of this disclosure.

FIGS. 4 to 6 show the holder member 200 depicted in FIGS. 3A and 3B according to an embodiment of this disclosure.

With reference to FIGS. 4 to 6, the holder member 200 according to an embodiment of this disclosure is disposed on the source printed circuit board 170 to hold the control printed circuit board 180. The holder member 200 may be made of a dielectric material with high strength. For example, it may be made of plastic materials, but is not limited thereto.

In an embodiment of this disclosure, the holder member 200 may be disposed in multiple quantities on both sides of the first connector 171. This arrangement relates to the positions where the source printed circuit board 170 using the flexibility of the first flexible circuit board 175 is folded and the control printed circuit board 180 using the flexibility of the second flexible circuit board 185 is folded.

Figure 8A:
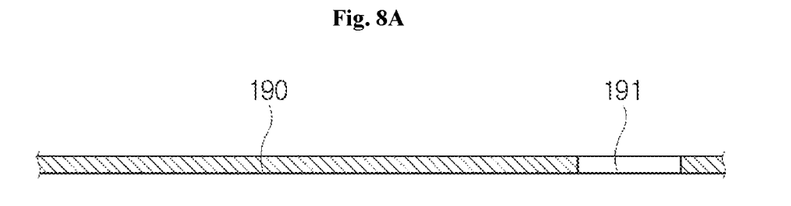
FIG. 8A is a diagram illustrating a state where a set mid-frame is arranged on top of a control printed circuit board according to an embodiment of this embodiment.

With reference to FIG. 8A, the display panel 150 and one end of the source printed circuit board 170 are connected through the first flexible circuit board 175 to allow the lower portion of the source printed circuit board 170 to be folded by the first flexible circuit board 175.

For smooth and rotatable folding, the control printed circuit board 180 is connected to the opposite end of the source printed circuit board 170 through the second flexible circuit board 185 so as to be folded in the direction opposite direction to that of the source printed circuit board 170, preventing interference when the source printed circuit board 170 and the control printed circuit board 180 are folded.

Here, the holder member 200 is disposed in multiple quantities on both sides of the first connector 171, connected to the second flexible circuit board 185, to hold and rotate the control printed circuit board 180. That is, it may be folded in the state of being connected to the second flexible circuit board 185.

In one embodiment, the holder member 200 may include a connecting part 240, a bending part 220, a head part 210, and an adjustment part 230 as shown in FIGS. 4 to 6.

The connecting part 240 may be in a bracket shape and have bolt holes 241 to be bolted and fixed to the source printed circuit board 170.

The bending part 220 may be connected to the connecting part 240 in a rotatable manner. The bending part 220 may include a first block 221, a second block 227, a first link pin 223, a second link pin 228, and a bending bar 225.

The first block 221 may be connected to the side of the head part 210 and have a shape of a relatively rectangular block.

The second block 227 may be connected to the side of the connecting part and have a shaped of a relatively long plate.

The bending bar 225 may connect the first block 221 and the second block 227 and have a shape of a relatively long plate.

Here, the first block 221 and the bending bar 225 may be connected by the first link pin 223. The first block 221 and the bending bar 225 may be connected to each other by the first link pin 223 as a rotation axis to allow for rotation.

The second block 227 and the connecting part 240 may be connected via the second link pin 228. The second block 227 may be connected by the second link pin as a rotation axis to allow for rotation.

The head part 210 may be connected to the bending part 220 and can hold the control printed circuit board 180. The head part 210 may include a first plate 211, a second plate 213, and a guide portion 215.

The first plate 211 may contact one surface of the control printed circuit board 180 and have a rectangular plate shape in an embodiment of this disclosure. However, it is not necessarily limited thereto.

The second plate 213 may contact the other surface of the control printed circuit board 180 and connect to the first plate 211. In an embodiment of this disclosure, the second plate 213 may have a rectangular plate shape. However, it is not necessarily limited thereto.

The above-described first block 221 may connect the sides of the first plate 211 and the second plate 213 to each other.

Here, the distance L between the first plate 211 and the second plate 213 may correspond to the thickness D of the control printed circuit board 180. That is, the distance L and the thickness D may be equal. The distance L may be slightly smaller than the thickness D. With this distance L, the control printed circuit board 180 may be inserted between the first plate 211 and the second plate 213 and securely held by the first plate 211 and the second plate 213.

The guide portion 215 may be formed on the end of the first plate 211 to guide the control printed circuit board 180 to be inserted between the first plate 211 and the second plate 213. In the embodiment of this disclosure, the guide portion 215 may form a curved surface facing away from the second plate 213 in the opposite direction at the end of the first plate 211. Alternatively, it may have a sloping surface or another shape that guides the insertion.

In this case, even though there is a slight error on the position in the edge of the control printed circuit board 180 between the first and second plates 211 and 213 when inserted between the first plate 211 and the second plate 213, the edge of the control printed circuit board 180 may slide along the curved surface of the guide portion 215 and be guided into the space between the first and second plates 211 and 213.

The adjustment part 230 may be coupled and positioned between the bending bar 225 and the second block 227 to adjust the range of rotation of the bending bar 225. The adjustment part 230 may include a movement hole 233, a moving pin 231, and a serrated portion 235.

The movement hole 233 may be formed by penetrating along the longitudinal direction of the second block 227.

The moving pin 231 is connected to the bending bar 225, penetrating the movement hole 233.

The serrated portion 235 may be arranged along the longitudinal direction of the movement hole 233 and may fix the position of the moving pin 231. The serrated portion 235 may be protruded at corresponding positions on the upper and lower surfaces of the moving hole 233, dividing the movement hole 233 into one or more sections in its longitudinal direction.

Accordingly, the moving pin 231 may move along the longitudinal direction of the movement hole 233 and stop by both ends thereof being fixed by the serrated portion 235, which results in the position of the moving pin 231 being fixed inside the movement hole 233.

When the position of the moving ping 231 is changed inside the movement hole 233, the range of rotation of the bending bar 225 connected to the moving pin 231 is adjusted.

For example, when the moving pin 231 is located at one end of the movement hole 233 and fixed by the serrated portion 235, compared to when the moving pin 231 is located at the other end of the movement hole 233 and fixed by the serrated portion 235, the bending bar 225 may rotate over a wider range with respective to the rotation of the second block 227 on the second linking pin 228 as the rotation axis. This changes the range of rotation of the control printed circuit board 180.

The inner surface of the movement hole 233 may also be formed into a polygonal shape. In this case, the outer surface of the moving pin 231 may be formed into a polygonal shape corresponding to the inner surface of the movement hole 233.

Accordingly, when the bending bar 225 rotates, the moving pin 231 also rotates and, resultantly, the polygonal surfaces in contact between the moving pin 231 and the movement hole 233 are changed. Due to the contact frictional resistance between the polygonal surfaces, the moving pin 231 may stop rotation, fixing the position of the bending bar 225.

That is, the polygonal shapes of the inner surface of the movement hole 233 and the outer surface of the moving pin 231 are formed to create contact frictional resistance therebetween, resulting in the fixation of the position of the bending bar 225 after rotation.

Figure 7:
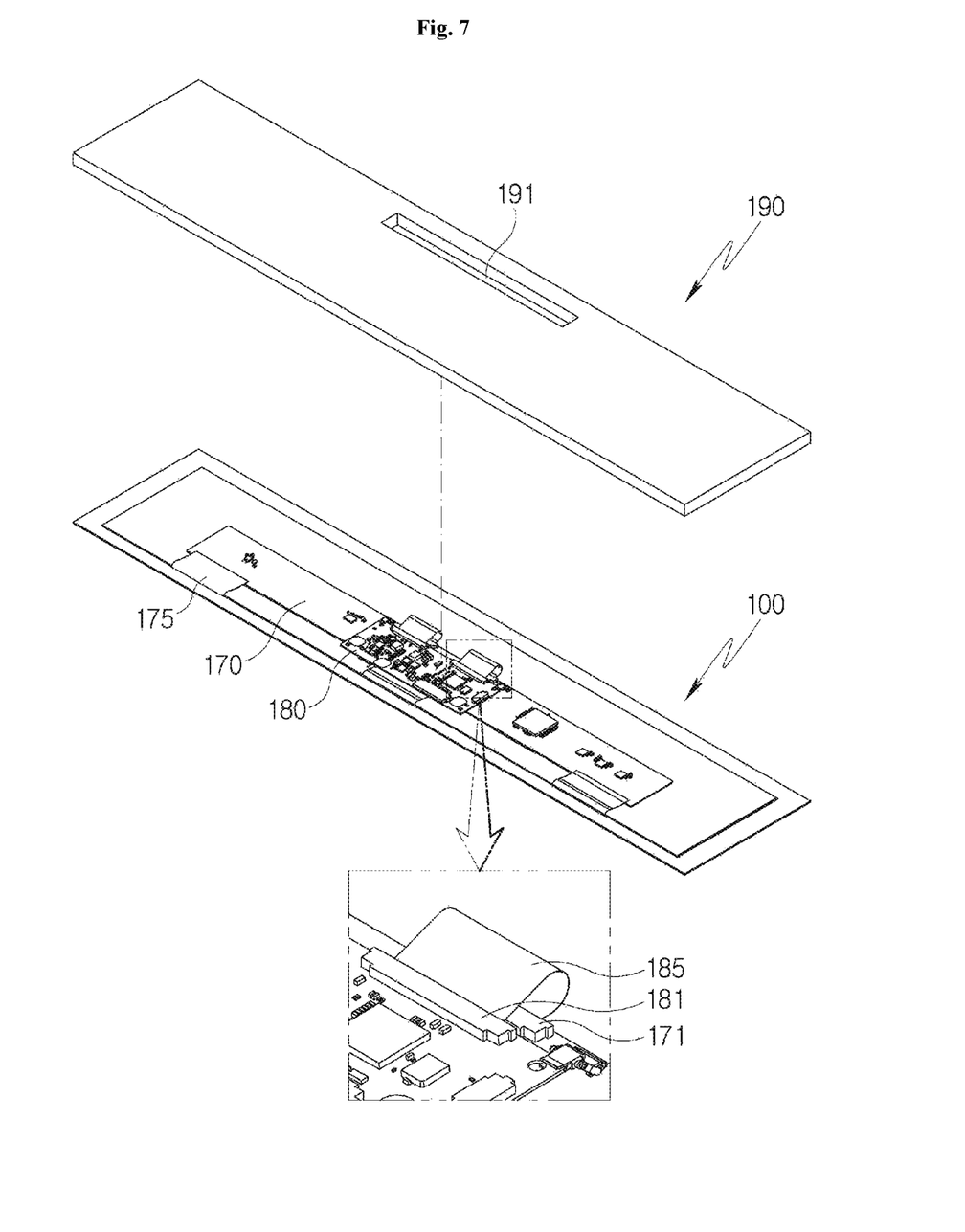
FIG. 7 is a perspective view illustrating the process of attaching a display apparatus to a set mid-frame according to an embodiment of this embodiment.

FIG. 7 shows how the display apparatus 100 is connected to the set mid-frame 190 according to an embodiment of this disclosure.

Figure 8B:
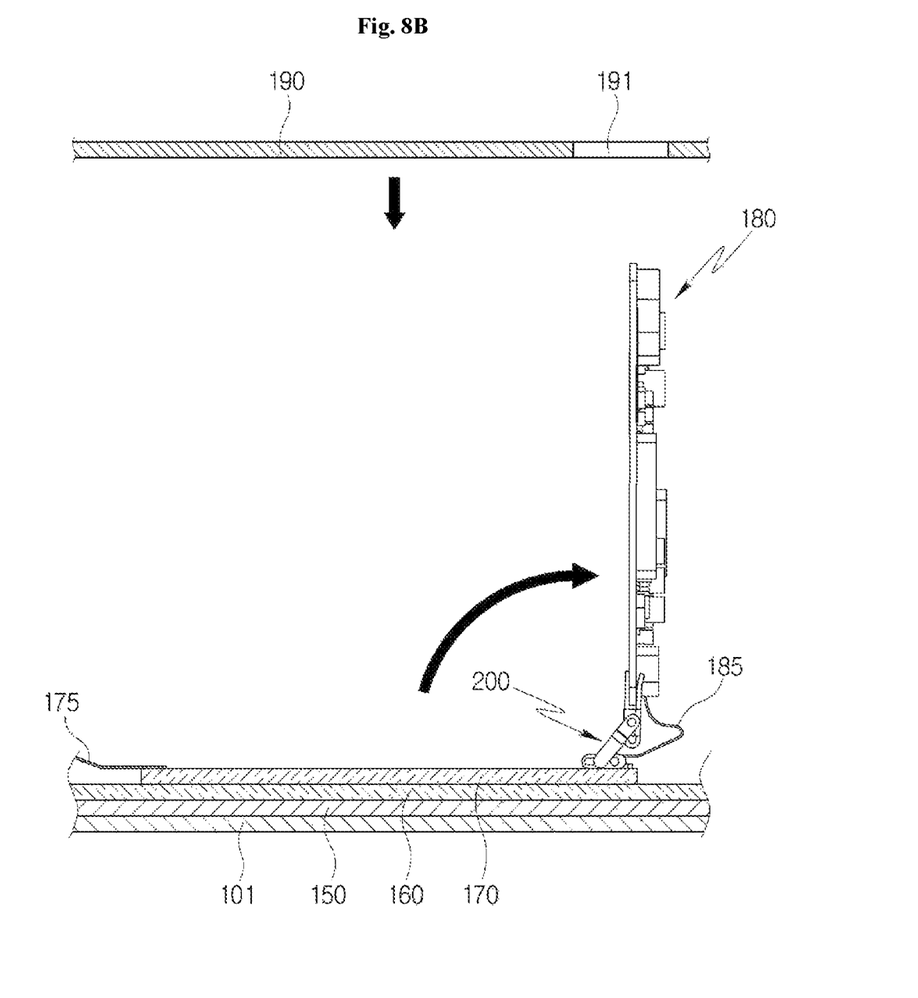
FIG. 8B is a diagram illustrating a state where a control printed circuit board is erected vertically by rotating a holder member according to an embodiment of this disclosure.
Figure 8C:
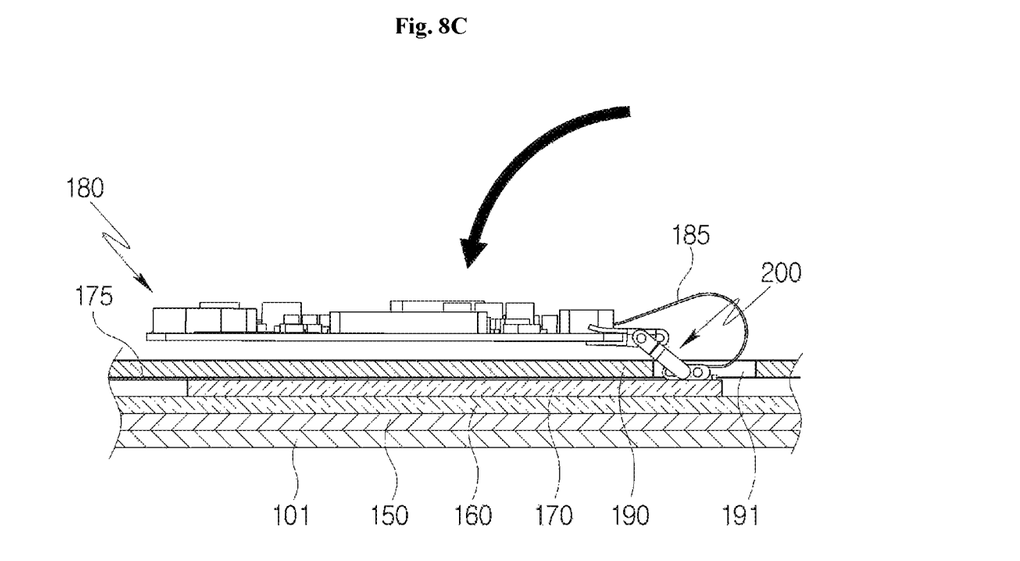
FIG. 8C is a diagram illustrating a state where a control printed circuit board passed through a through opening of the set mid-frame is folded down by rotating a holder member according to an embodiment of this disclosure.

FIG. 8A illustrates a state where a set mid-frame 190 is arranged on top of a control printed circuit board 180 according to an embodiment of this embodiment, FIG. 8B illustrates a state where a control printed circuit board 180 is erected vertically by rotating a holder member 200 according to an embodiment of this disclosure, and FIG. 8C illustrates a state where a control printed circuit board 180 passed through a through opening 191 of the set mid-frame 190 is folded down by rotating a holder member 200 according to an embodiment of this disclosure.

With reference to FIG. 7, the control printed circuit board 180 is inserted into the through opening 191 of the set mid-frame 190, thereby combining the set mid-frame 190 and the control printed circuit board 180.

In the past, after removing the fixing tape and separating the control printed circuit board 180 from the source printed circuit board 170 by disconnecting the second flexible circuit board 185 from the first connector 171 or the second connector 181, the set mid-frame 190 was placed on top of the source printed circuit board 170. Then, the control printed circuit board 180 was placed on top of the set mid-frame 190, and the second flexible circuit board 185 was connected to either the first connector 171 or the second connector 181 through the through opening 191 to complete the assembly.

According to an embodiment of this disclosure, the assembly process is performed as described with reference to FIGS. 8A to 8C, which is simpler and more convenient than the conventional method.

With reference to FIG. 8A, the first flexible circuit board 175 is folded on top of the display panel 150, the source printed circuit board 170 is placed, the second flexible circuit board 185 is folded on top of the source printed circuit board 170, and the control printed circuit board 180 is placed.

To install the display apparatus 100 on a vehicle or the like, the control printed circuit board 180 is inserted through the through opening 191 of the set mid-frame 190 and placed in position.

In order to insert the control printed circuit board 180 through the through opening 191 of the set mid-frame 190, the bending part 220 is rotated to make the control printed circuit board 180 stand vertically as shown in FIG. 8B.

After inserting the control printed circuit board 180 through the through opening 191, the bending unit 220 is rotated to lay the control printed circuit board 180 horizontally, as shown in FIG. 8C, and then attach it to the back surface of the set mid-frame 190.

That is, the control printed circuit board 180 can be easily attached to the set mid-frame 190 with a simple operation of rotating the bending unit 220 of the holder member 200 with no need to remove the fixing tape and disconnect the second flexible circuit board 185 connecting the control printed circuit board 180 and the source printed circuit board 170, unlike the conventional method.

Through the above-described structure and assembly method, the present disclosure is capable of simplifying the process of installation of the display apparatus 100 to a vehicle by allowing for immediate attachment of the control printed circuit board 180 to the set mid-frame 190 without the need to detach it, which is not possible in the conventional method. Furthermore, by allowing stable fixation of the control printed circuit board during logistics transportation, it is possible to minimize its movement and prevent damage.

The above description merely illustrates a specific embodiment of the display apparatus.

Therefore, it should be noted that those skilled in the art can easily understand that this disclosure can be substituted or modified in various forms without departing from the scope of the claims below and intention of this disclosure.

DESCRIPTION OF REFERENCE NUMERALS

100: display apparatus
101: cover member
150: display panel
160: heat dissipation plate
170: source printed circuit board
171: first connector
175: first flexible circuit board
180: controlled printed circuit board
181: second connector
185: second flexible circuit board
190: set mid-frame
191: through opening
200: holder member
210: head part
211: first plate 213: second plate
215: guide portion
220: bending part
221: first block
223: first link pin
225: bending bar
227: second block
228: second link pin
230: adjustment part
231: moving pin
233: movement hole
235: serrated portion
240: connecting part

What is claimed is:

1. A display apparatus comprising: a display panel; a source printed circuit board on a back surface of the display panel, the source printed circuit board connected to the display panel via a first flexible circuit board; a control printed circuit board connected to the source printed circuit board via a second flexible circuit board; and a holder member arranged on the source printed circuit board, the holder member holding the control printed circuit board, wherein the holder member comprises: a connecting part fixed to the source printed circuit board; a bending part connected rotatably to the connecting part; and a head part connected to the bending part, the head part holding the control printed circuit board.

2. The display apparatus of claim 1, wherein the head part comprises a first plate contacting one surface of the control printed circuit board and a second plate connected to the first plate and contacting another surface of the control printed circuit board, and the first plate and the second plate have a distance corresponding to a thickness of the control printed circuit board.

3. The display apparatus of claim 2, wherein the head part further comprises a guide portion at an end of the first plate, the guide portion guiding an insertion of the control printed circuit board between the first plate and the second plate.

4. The display apparatus of claim 3, wherein the guide portion comprises a curve in a direction opposite to a direction facing the second plate from the first plate.

5. The display apparatus of claim 1, wherein the bending part comprises:
 a first block connected to a side of the head part;
 a second block connected to a side of the connecting part; and
 a bending bar connecting the first block and the second block.

6. The display apparatus of claim 5, wherein the bending part further comprises a first pin connecting the first block and the bending bar, wherein the first block or the bending bar is rotatable around the first pin as an axis of rotation.

7. The display apparatus of claim 6, wherein the bending part further comprises a second link pin connecting the second block and the connecting part, wherein the second block is rotatable around the second link pin as an axis of rotation.

8. The display apparatus of claim 7, further comprising:
 an adjustment part engaged between the bending bar and the second block, the adjustment part adjusting a rotation range of the bending bar.

9. The display apparatus of claim 8, wherein the adjustment part comprises:
 a movement hole formed along a longitudinal direction of the second block; and a moving pin connected to the bending bar and arranged inside the movement hole, wherein the moving pin adjusts the rotation range of the bending bar by changing in position inside the movement hole.

10. The display apparatus of claim 9, wherein the adjustment part further comprises a serrated portion arranged along a longitudinal direction of the movement hole, the serrated portion fixing a position of the moving pin.

11. The display apparatus of claim 10, wherein the movement hole comprises an inner surface having a polygonal shape.

12. The display apparatus of claim 11, wherein the moving pin comprises an outer surface having a polygonal shape corresponding to the inner surface of the movement hole, and the inner surface of the movement hole and the outer surface of the moving pin fixes a rotation position of the bending bar by generates a contact frictional resistance.

13. The display apparatus of claim 1, wherein the display panel and one end of the source printed circuit board are connected via the first flexible circuit board, and the control printed circuit board and another end of the source printed circuit board are connected via the second flexible circuit board.

14. The display apparatus of claim 13, wherein the source printed circuit board further comprises a first connector configured to be connected to the second flexible circuit board, and the holder member is disposed in multiple quantities on both sides of the first connector.

* * * * *